(12) United States Patent
Song et al.

(10) Patent No.: US 9,472,425 B2
(45) Date of Patent: Oct. 18, 2016

(54) POWER DISTRIBUTION IMPROVEMENT USING PSEUDO-ESR CONTROL OF AN EMBEDDED PASSIVE CAPACITOR

(71) Applicant: QUALCOMM Incorporated, San Diego, CA (US)

(72) Inventors: Young Kyu Song, San Diego, CA (US); Kyu-Pyung Hwang, Newton, MA (US); Jae Sik Lee, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/663,342

(22) Filed: Mar. 19, 2015

(65) Prior Publication Data

US 2016/0276173 A1 Sep. 22, 2016

(51) Int. Cl.
*H01L 21/48* (2006.01)
*H01L 23/498* (2006.01)
*H01L 49/02* (2006.01)

(52) U.S. Cl.
CPC ....... *H01L 21/4846* (2013.01); *H01L 21/4853* (2013.01); *H01L 21/4875* (2013.01); *H01L 23/498* (2013.01); *H01L 23/49816* (2013.01); *H01L 23/49838* (2013.01); *H01L 28/60* (2013.01)

(58) Field of Classification Search
CPC ............ H01L 23/552; H01L 23/147; H01L 23/5223; H01L 23/50; H01L 2924/00; H01L 2224/023; H01L 2224/0233; H01L 2224/02373; H01L 23/5222; H01L 2924/181; H01L 2224/96; H01L 2224/16265; H01L 2224/12105
See application file for complete search history.

(56) References Cited

U.S. PATENT DOCUMENTS

| | | | |
|---|---|---|---|
| 7,778,038 B2 | 8/2010 | McGregor et al. | |
| 8,059,423 B2 | 11/2011 | Biunno | |
| 8,410,579 B2 | 4/2013 | Ghia et al. | |
| 2004/0027813 A1* | 2/2004 | Li | H01L 23/49822 361/767 |
| 2008/0186654 A1 | 8/2008 | Takeshima et al. | |
| 2012/0044028 A1 | 2/2012 | Hollis et al. | |
| 2012/0193781 A1 | 8/2012 | Costa et al. | |
| 2014/0239438 A1* | 8/2014 | Kilger | H01L 21/82 257/528 |
| 2014/0252548 A1 | 9/2014 | Yen et al. | |
| 2016/0183386 A1* | 6/2016 | Song | H05K 3/4644 174/260 |

OTHER PUBLICATIONS

International Search Report and Written Opinion—PCT/US2016/019948—ISA/EPO Jun. 2, 2016.

\* cited by examiner

*Primary Examiner* — Jasmine Clark
(74) *Attorney, Agent, or Firm* — Seyfarth Shaw LLP

(57) ABSTRACT

A fan-out wafer level package structure may include a multilayer redistribution layer (RDL). The multilayer RDL may be configured to couple with terminals of an embedded capacitor. The multilayer RDL may include sections with fewer layers than other sections of the multilayer RDL according to a selected equivalent series resistance (ESR) control pattern.

14 Claims, 11 Drawing Sheets

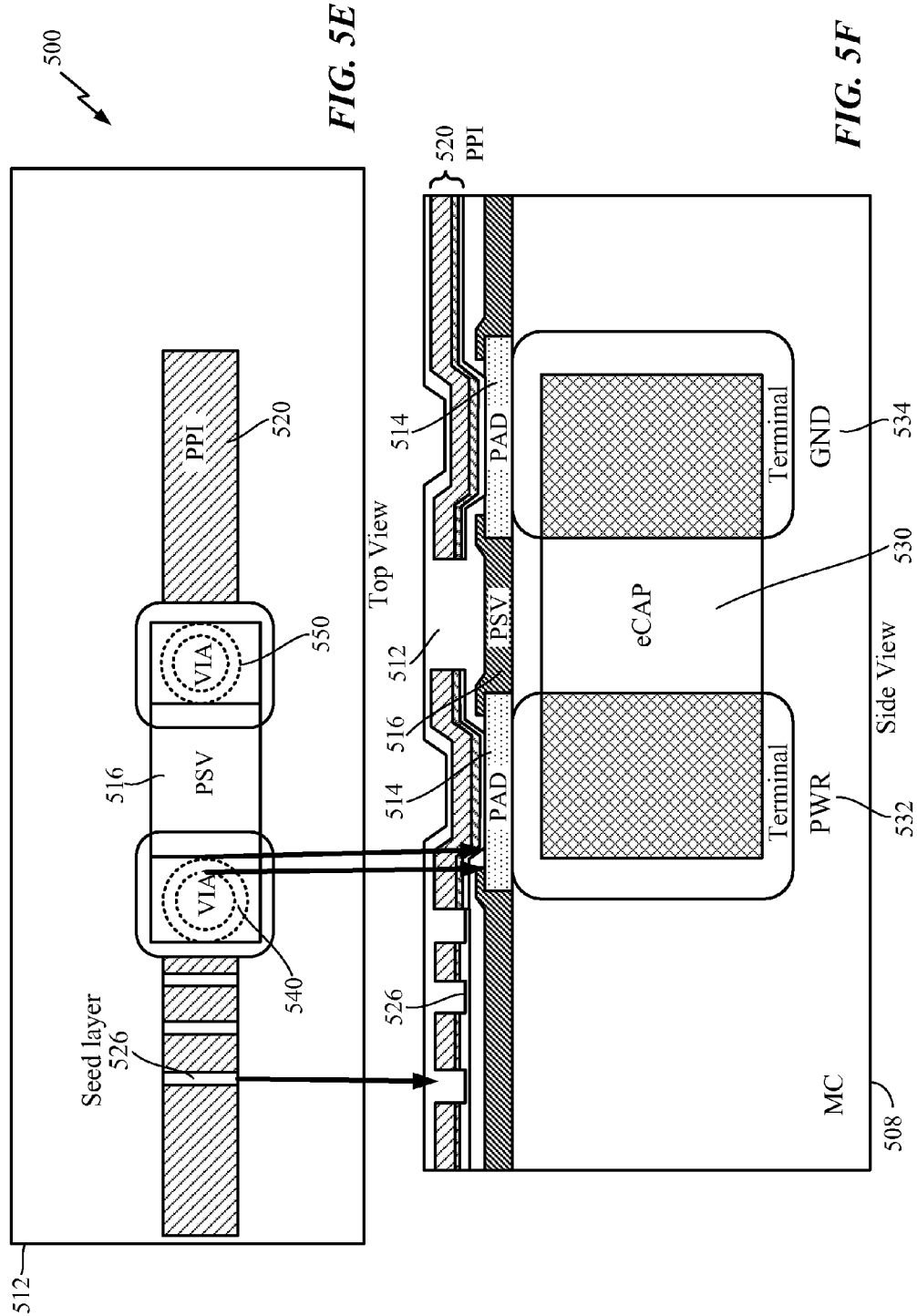

… (1)

POWER DISTRIBUTION IMPROVEMENT USING PSEUDO-ESR CONTROL OF AN EMBEDDED PASSIVE CAPACITOR

BACKGROUND

1. Field

Aspects of the present disclosure relate to semiconductor devices, and more particularly to a power distribution improvement using pseudo-equivalent series resistance (ESR) control of an embedded capacitor.

2. Background

The process flow for semiconductor fabrication of integrated circuits (ICs) may include front-end-of-line (FEOL), middle-of-line (MOL), and back-end-of-line (BEOL) processes. The front-end-of-line processes may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other like active devices. The back-end-of-line processes may include a series of wafer processing steps for interconnecting the semiconductor devices created during the front-end-of-line and middle-of-line processes. Successful fabrication of modern semiconductor chip products involves an interplay between the materials and the processes employed.

An interposer is a die-mounting technology in which the interposer serves as a base upon which the semiconductor dies of a system on chip (SoC) are mounted. An interposer is an example of a fan-out wafer level package structure. The interposer may include wiring layers of conductive traces and conductive vias for routing electrical connections between the semiconductor dies (e.g., memory modules and processors) and a system board. The interposer may include a redistribution layer (RDL) that provides a connection pattern of bond pads on the active surface of a semiconductor device (e.g., a die or chip) to a redistributed connection pattern that is more suitable for connection to the system board. In most applications, the interposer does not include active devices such as diodes and transistors.

For integrated circuits used in wireless communications devices or other high-speed digital electronics, a power delivery network supplies power to the various components of the overall system. A power delivery network may include a voltage regulator module (VRM) that provides regulated voltage for the system. Suppressing resonance in a power delivery network may be performed using a capacitor. Currently, equivalent series resistance (ESR) control is available in surface mount technology (SMT) capacitors. Fabrication of a fan-out wafer level package structure may include an embedded capacitor. Unfortunately, ESR control within fan-out wafer level package structures is not available.

SUMMARY

A fan-out wafer level package structure may include a multilayer redistribution layer (RDL). The multilayer RDL may be configured to couple with terminals of an embedded capacitor. The multilayer RDL may include sections with fewer layers than other sections of the multilayer RDL according to a selected equivalent series resistance (ESR) control pattern.

A method for a fan-out wafer level package structure may include depositing a seed layer of a multilayer redistribution layer (RDL) on an embedded passive substrate. The method may also include depositing a coupling layer of the multilayer RDL on the seed layer. The method may further include depositing a plating layer of the multilayer RDL on the coupling to complete formation of the multilayer RDL. The method may also include patterning and etching the multilayer RDL to expose portions of a RDL layer according to a selected ESR control pattern.

A fan-out wafer level package structure may include a multilayer redistribution layer (RDL). The multilayer RDL may be configured to couple with a means for storing charge. The multilayer RDL may include sections with fewer layers than other sections of the multilayer RDL according to a selected equivalent series resistance (ESR) control pattern.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A-5F further illustrate the fan-out wafer level package structure of FIGS. 4A and 4B at various stages of fabrication according to aspects of the present disclosure.

DETAILED DESCRIPTION

Figure 1:
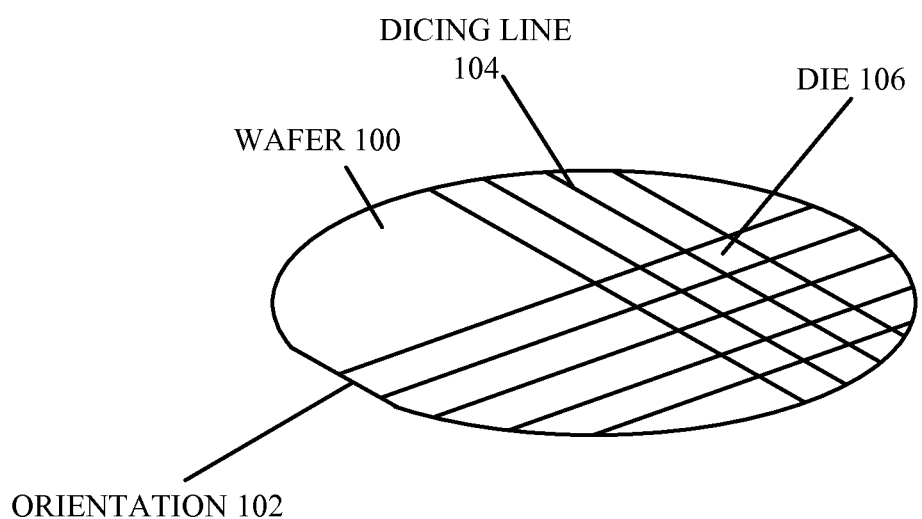
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Some described implementations relate to a fan-out wafer level package structure, such as an interposer. An interposer generally serves as an intermediate layer that can be used for direct electrical interconnection between one component or substrate and a second component or substrate with the interposer positioned in between. For example, an interposer may have a pad configuration on one side that can be aligned with corresponding pads on a first component (e.g., a die), and a different pad configuration on a second side that corresponds to pads on a second component (e.g., a package substrate, system board, etc.) Interposers are widely used for integrating multiple chips in a single package. In addition, interposer substrates can be composed of glass and quartz, organic, or other like material and normally contain a few interconnect layers.

For integrated circuits used in wireless communication devices or other high-speed digital electronics, a power delivery network supplies power to the various components of the overall system. A power delivery network may include a voltage regulator module (VRM) that provides regulated voltage for the system. Suppressing resonance in the power delivery network may be performed using a capacitor. Currently, equivalent series resistance (ESR) control is not available for land side capacitors in a package structure. As a result, providing ESR control at the board level for a power distribution network involves the use of ESR controlled surface mount technology (SMT) capacitors. Deployment of multiple ESR controlled SMT capacitors to provide ESR control at the board level, however, is costly and takes up significant board space. Fabrication of fan-out wafer level package structures may include an embedded capacitor. Unfortunately, ESR control within, for example, an embedded passive substrate of the fan-out wafer level package structures is not available.

Fabrication of wafer level package structures, such as interposers, may include the formation of a redistribution layer (RDL). The redistribution layer may enable expansion of a connection pattern of bond pads on the active surface of an active device (e.g., a die or chip) to a redistributed connection pattern that is more suitable for connection to a substrate (e.g., system board, package substrate, printed circuit board, etc.) In one aspect of the present disclosure, an embedded wafer level ball grid array (eWLB) may include an ESR controlled embedded passive substrate (EPS). In this aspect of the disclosure, an ESR control feature is implemented in the eWLB for a performance improved power delivery network. In one configuration, a high resistivity path to an embedded capacitor is provided by a multi-layer redistribution layer with exposed portions of an RDL layer to provide an ESR controller for the embedded capacitor.

Various aspects of the disclosure provide techniques for a power distribution improvement within fan-out wafer level packages (e.g., an embedded wafer level ball grid array (eWLB)) using pseudo-ESR control of an embedded passive capacitor. The process flow for semiconductor fabrication of the fan-out wafer level package structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" or may refer to a substrate of a diced wafer or may refer to the substrate of a wafer that is not diced. Similarly, the terms chip and die may be used interchangeably unless such interchanging would tax credulity.

As described herein, the middle-of-line interconnect layers may refer to the conductive interconnects for connecting a first conductive layer (e.g., metal one (M1)) of the back-end-of-line to the oxide diffusion (OD) layer of an integrated circuit as well for connecting M1 to the active devices of the integrated circuit. The middle-of-line interconnect layers for connecting M1 to the OD layer of an integrated circuit may be referred to as "MD1" and "MD2." The middle-of-line interconnect layer for connecting M1 to the poly gates of an integrated circuit may be referred to as "MP." A middle-of-line zero via (V0) may connect M1 to the middle-of-line interconnect layers.

A fan-out wafer level package structure within a power delivery network, according to an aspect of the present disclosure, includes a multilayer redistribution layer (RDL). The multilayer RDL may be configured to couple with terminals of a capacitor embedded within the fan-out wafer level package structure. In one configuration, the multilayer RDL includes sections with fewer layers than other sections of the multilayer RDL. In this configuration, the multilayer RDL is patterned to expose portions of an RDL layer by removing one or more layers of the multilayer RDL according to a selected equivalent series resistance (ESR) control pattern. The ESR control pattern is selected to provide a desired ESR value along an increased resistivity path provided by the exposed portions of the RDL layer. When the multilayer RDL is coupled to an embedded capacitor, the exposed portions of the RDL layer provide ESR control of the embedded capacitor along an increased resistance path. The ESR controlled embedded capacitor suppresses resonance in the power delivery network including the fan-out wafer level package structure. The increased resistance path provided by the exposed portions of the RDL layer of the multilayer RDL for ESR control may be verified through testing.

The multilayer is coupled to terminals of the embedded capacitor. The multilayer RDL may be a fan-out routing layer. The multilayer RDL may be patterned and etched to expose portions of a seed layer (e.g., titanium) according to a selected ESR control pattern. The ESR control pattern may be selected to provide a predetermined resistance within a predetermined range (e.g., 100 milliohms to 500 milliohms). The multilayer redistribution layer may be coupled to a chip to provide ESR control. Implementing the fan-out wafer level package structure with embedded ESR control provides a damping feature, while suppressing resonance within a power distribution network.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
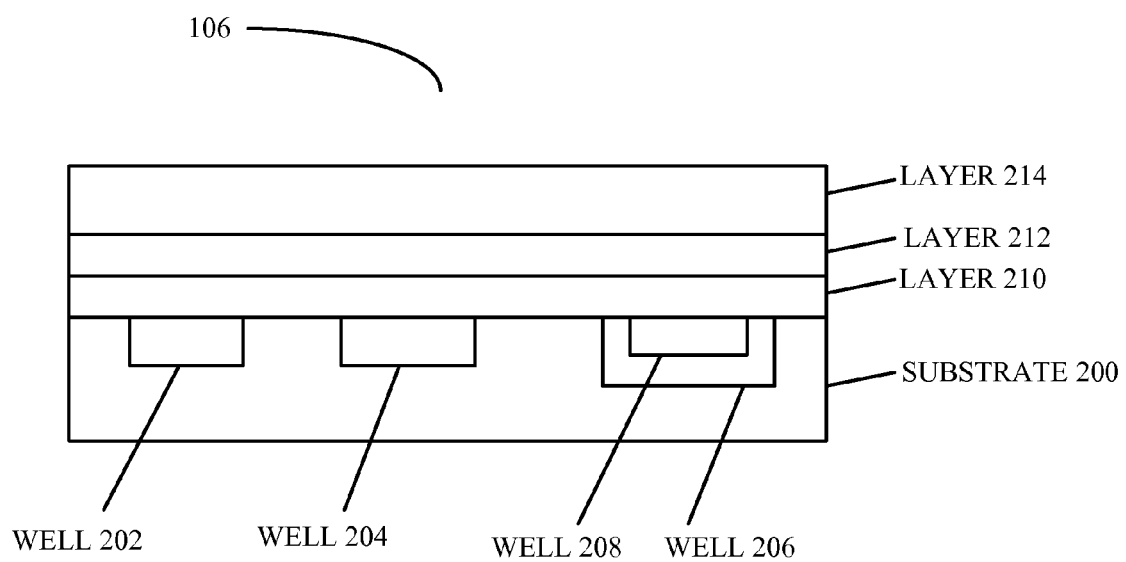
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
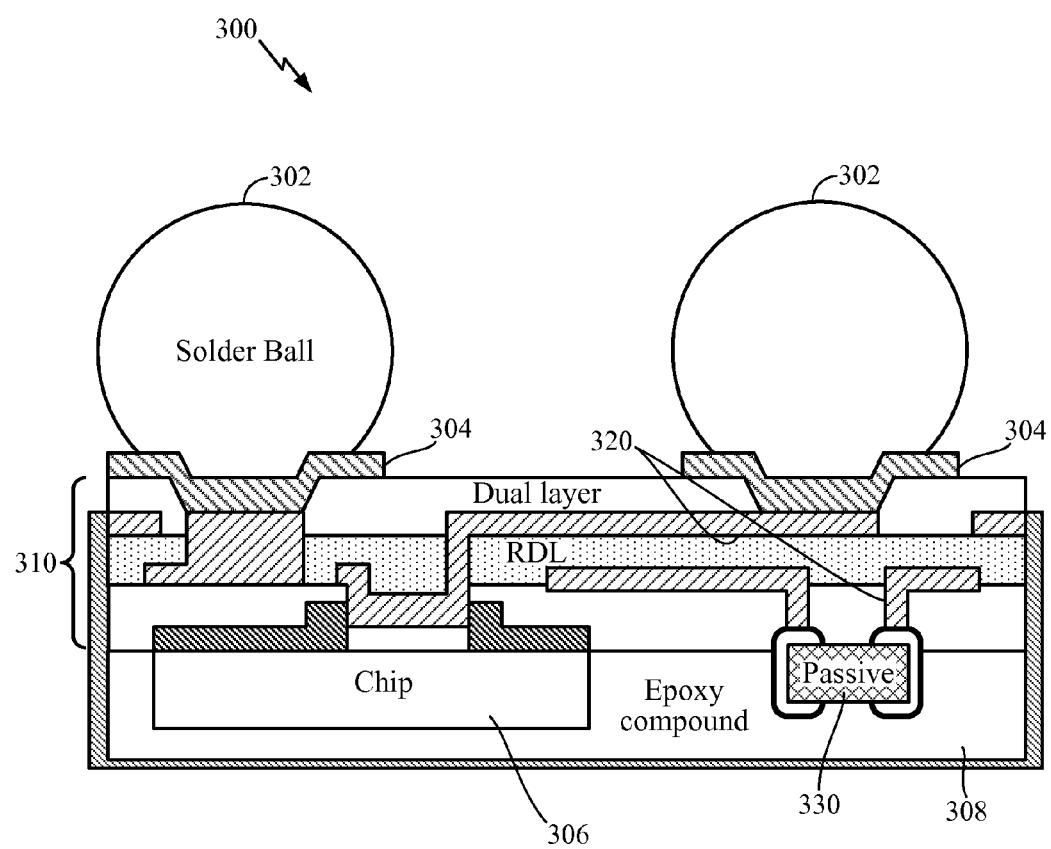
FIG. 3 illustrates a fan-out wafer level package structure according to one aspect of the present disclosure.

FIG. 3 illustrates a fan-out wafer level package structure 300 including a multilayer redistribution layer 320 according to one aspect of the present disclosure. The fan-out wafer level package structure 300 may couple a conductive interconnect 302 to a chip 306 through the multilayer redistribution layer 320. In this arrangement, the multilayer redistribution layer 320 couples to terminals of an embedded passive device (e.g., an embedded capacitor 330). The fan-out wafer level package structure 300 also includes an embedded passive substrate 310 on the chip 306 with a molding compound 308 (e.g., epoxy) surrounding the chip 306. The multilayer redistribution layer 320 is coupled to the conductive interconnect 302 through, for example, an under fill interconnect layer 304 (e.g., an under bump metallization (UBM) layer). As described in further detail below, patterning and etching may be performed to exposed portions of an RDL layer of the multilayer redistribution layer 320 to provide an increased resistance path.

Figure 4A:
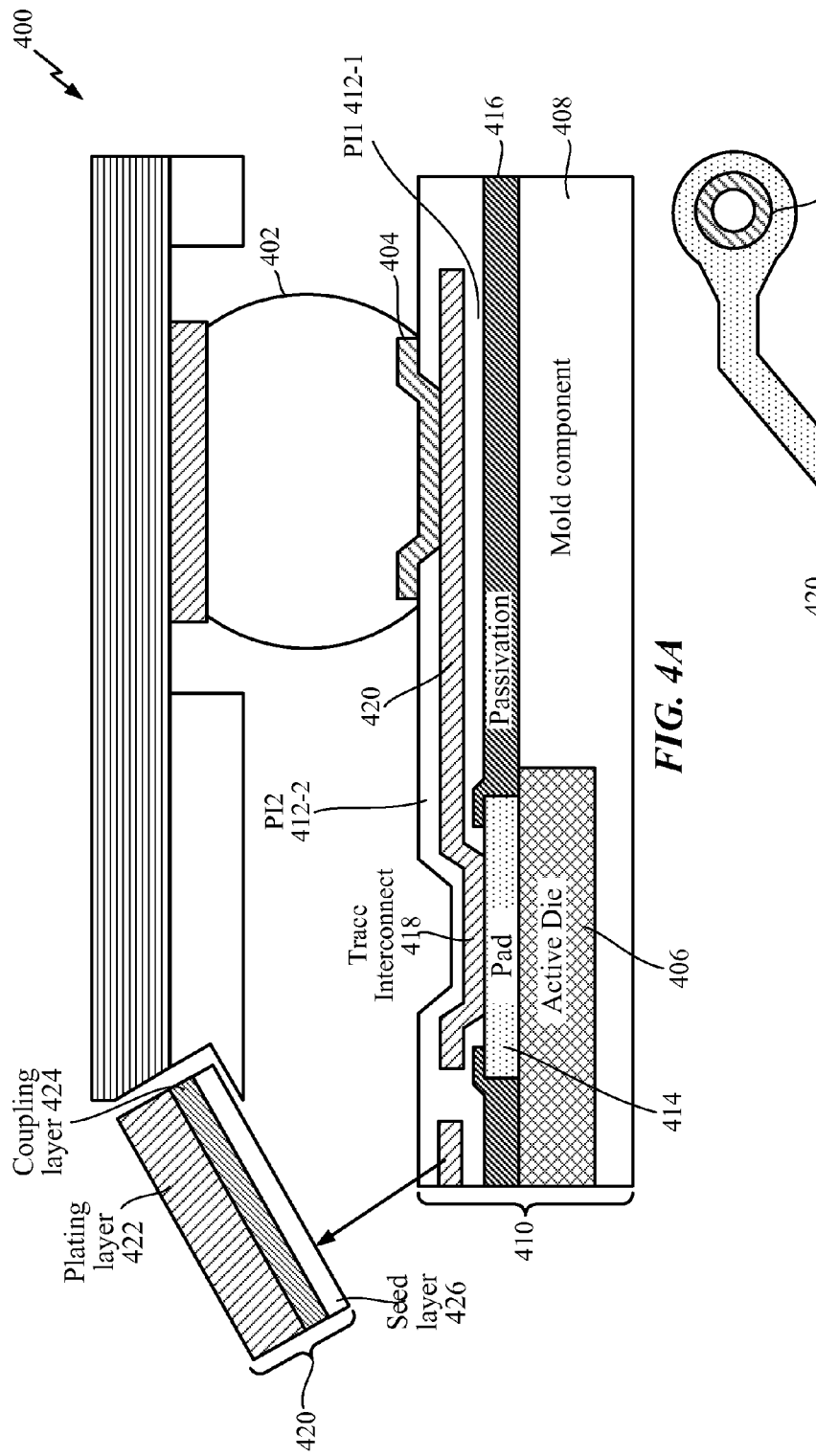
FIGS. 4A-4B further illustrate the fan-out wafer level package structure of FIG. 3 including a multilayer redistribution layer according to aspects of the present disclosure.
Figure 4B:
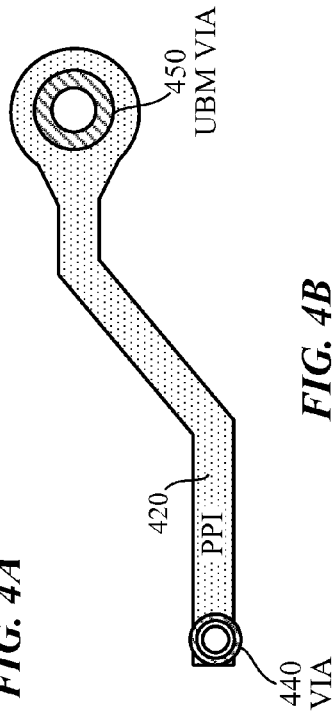

FIGS. 4A and 4B illustrate a fan-out wafer level package structure 400 including a multilayer redistribution layer 420 according to one aspect of the present disclosure. In this configuration, the multilayer redistribution layer 420 includes a seed layer 426 (e.g., sputtered titanium (Ti)), a coupling layer 424 (e.g., sputtered copper (Cu)) on the seed layer 426 and a plating layer 422 (e.g., plated Cu) on the coupling layer 424. In one aspect of the disclosure, portions of an RDL layer (e.g., the seed layer 426) are exposed to provide an increased resistance path along the multilayer redistribution layer 420. The RDL layers (e.g., 422, 424, 426) of the multilayer redistribution layer 420 may facilitate communication between an active die 406 (e.g., a semiconductor die) and the conductive interconnect 402 (e.g., a ball grid array (BGA)) of the fan-out wafer level package structure 400 (e.g., an embedded wafer level package BGA (eWLB)). Although specific conductive layers of the multilayer redistribution layer 420 are described, it should be recognized that additional configurations are possible according to the desired ESR control.

In this arrangement, an embedded passive substrate 410 includes a passivation layer 416 on a mold compound 408 surrounding the active die 406. The passivation layer 416 is also on side walls and a surface of a conductive pad 414 (e.g., an application processor (AP) pad). A first organic layer 412-1 (e.g., polyimide PI1) is on the passivation layer 416 and the conductive pad 414. In this configuration, the multilayer redistribution layer 420 is formed on the first organic layer 412-1, and may be referred to as a post passivation interconnect (PPI). The multilayer redistribution layer 420 is coupled to the conductive pad 414 through a trace interconnect 418 (e.g., Cu). A second organic layer 412-2 (e.g., polyimide PI2) is on the passivation layer 416 and the conductive pad 414 as well as the passivation layer 416.

FIG. 4B further illustrates the multilayer redistribution layer 420 as a post passivation interconnect (PPI). The multilayer redistribution layer 420, at one end, is coupled to the trace interconnect 418 and the conductive pad 414 through an AP via 440. An opposing end of the multilayer redistribution layer 420 is coupled to an under fill interconnect layer 404 (e.g., an under bump metallization (UBM) layer, as shown in FIG. 4A) and the conductive interconnect 402 through an UBM via 450. The AP via 440 and/or the UBM via 450 may be formed by a damascene process, an additive etch and fill process, a laser via and fill process or other like process for via formation. The under fill interconnect layer 404 may be formed within a PI2 via of the second organic layer 412-2. Similarly, the trace interconnect 418 may be formed within a PI2 via of the first organic layer 412-1 (PI1). The multilayer redistribution layer 420 may be patterned and etched according to a selected equivalent series resistance (ESR) control pattern, as shown in FIGS. 5B to 5F.

Figure 5A:
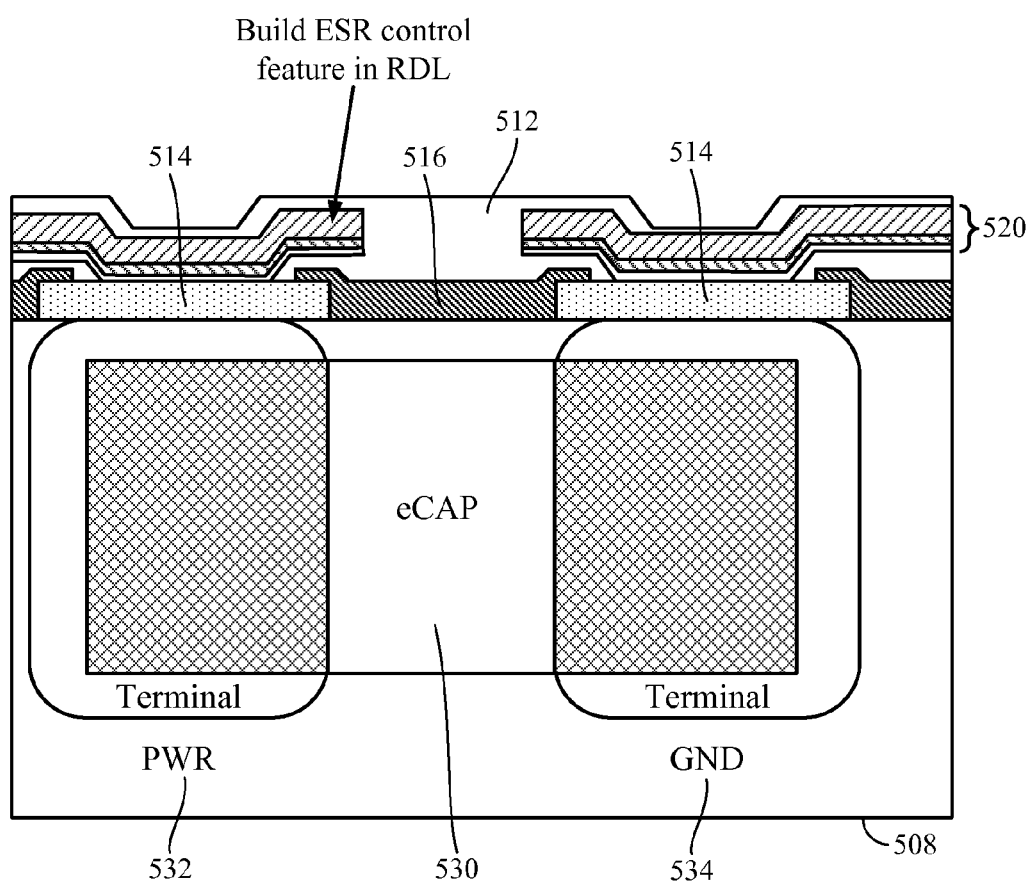

FIG. 5A further illustrates the multilayer redistribution layer of the fan-out wafer level package structure of FIG. 4A according to one aspect of the present disclosure. In this arrangement, the multilayer redistribution layer 520 includes multiple RDL layers (e.g., 422, 424, 426) disposed on conductive pads 514. The conductive pads 514 are partially surrounded by a passivation layer 516 and organic layer 512. In this example, the conductive pads 514 are coupled to a power terminal 532 and a ground terminal 534 of an embedded capacitor 530 within a mold compound 508. As described in FIGS. 5B to 5F, portions of an RDL layer (e.g., 526) are exposed to provide an increased resistance path along the multilayer redistribution layer 520 for ESR control of the embedded capacitor 530. Although the multilayer redistribution layer 520 is shown with three layers, it should be recognized that more or fewer layers may be provided within the multilayer redistribution layer 520. Furthermore, although a single RDL layer of the multilayer redistribution layer 520 is exposed, additional layers may be exposed according to a desired increased resistivity path.

Figure 5B:
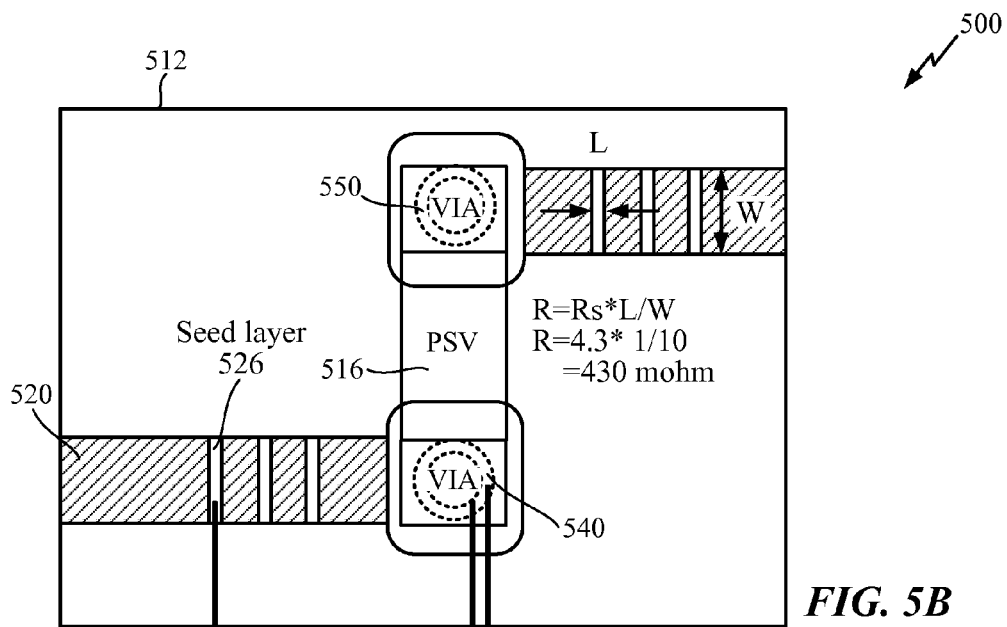
Figure 5C:
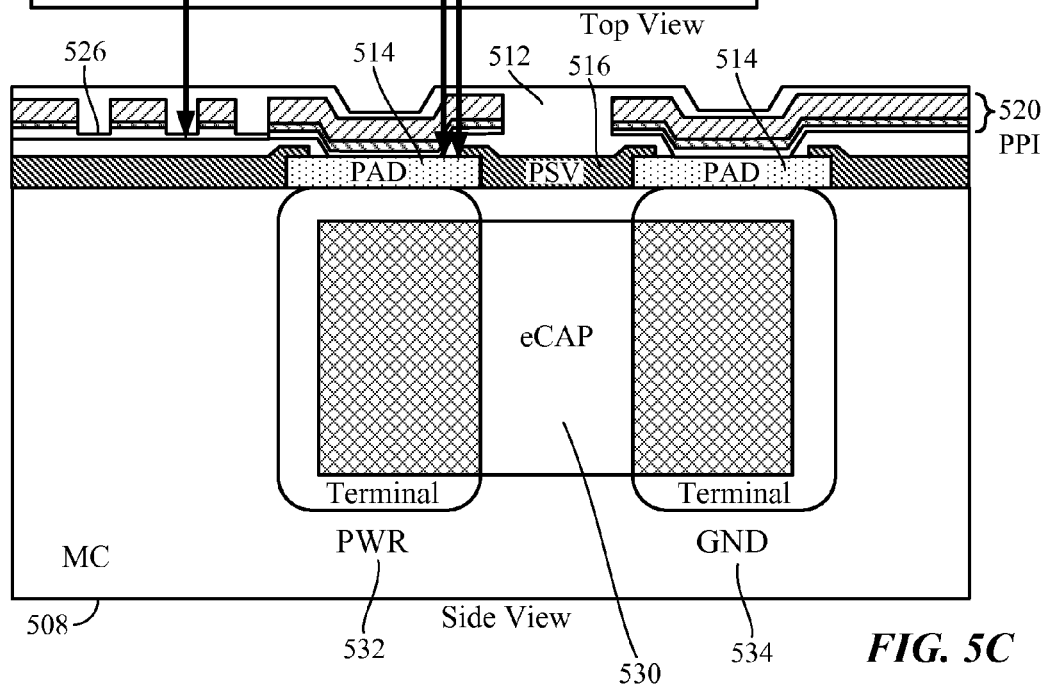

FIGS. 5B-5F illustrate a fan-out wafer level package structure 500 at various stages of fabrication according to aspects of the present disclosure. For example, FIGS. 5B and 5C illustrate a top view and a side view of the fan-out wafer level package structure 500. In FIG. 5B, the multilayer redistribution layer 520 is patterned and etched to expose portions of an RDL layer 526 (e.g., a Ti seed layer). In this arrangement, the multilayer redistribution layer 520 is surrounded by an organic layer 512 and coupled through a first terminal via 540 to the power terminal 532 of the embedded capacitor 530, as shown in the side view of FIG. 5C. In FIG. 5C, the exposed portions of the RDL layer 526 provided an increased resistance path to the power terminal 532 for providing ESR control to the embedded capacitor 530.

In this arrangement, the multilayer redistribution layer 520 is coupled to a second via 550 and the first terminal via 540 through a passivation layer 516. The second via may be a UBM via, an AP via or a terminal via. In this configuration, an ESR control pattern is selected to provide a predetermined resistance within a predetermined range (e.g., 100 milliohms to 500 milliohms). For example, a resistance (Rs) of the RDL layer 526 may be, for example, 4.3 ohms, and assuming a length (L) of the RDL layer 526 and a width (W) of the multilayer redistribution layer 520, the predetermined resistance (R) is computed as follows:

$$R = Rs * L/W \qquad (1)$$

According to equation (1), the predetermined resistance R is equal to (4.3*1/10=) 430 milliohms along the multilayer redistribution layer 520 for ESR control of the embedded capacitor 530.

Figure 5D:
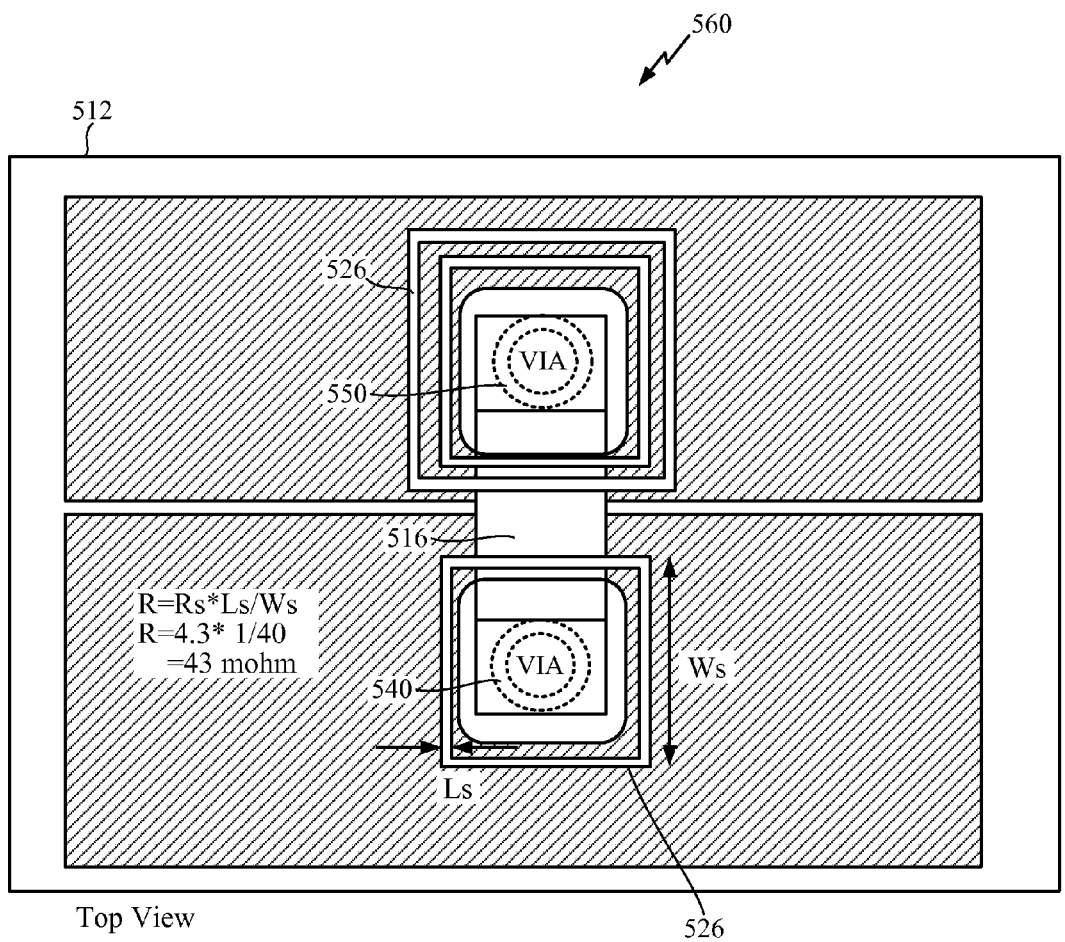

FIG. 5D illustrates another ESR control pattern 560 that is selected to a different predetermined resistance value R. For example, a resistance (Rs) of the RDL layer 526 may be, for example, 4.3 ohms, and assuming a length (Ls) of the RDL layer 526 and a width (Ws) of the RDL layer 526, the predetermined resistance R is computed as follows:

$$R = Rs * Ls/4Ws \qquad (2)$$

According to equation (2), the predetermined resistance R is equal to (4.3*1/40=) 43 milliohms along the multilayer redistribution layer 520 for ESR control of the embedded capacitor 530. Although the ESR control patterns are illustrated with reference to rectangular and square ESR control patterns, it should be recognized that other ESR control patterns are possible depending on the desired, predetermined resistance. In this arrangement, the multilayer redistribution layer 520 is coupled to the second via 550 and the first terminal via 540 through the passivation layer 516 and surrounded by the organic layer 512.

FIGS. 5E and 5F illustrate a top view and a side view of the fan-out wafer level package structure 500 having the multilayer redistribution layer 520 in which portions of an RDL layer (e.g., 526) are exposed to provide an increased resistance path according to aspects of the present disclosure. In FIG. 5E, the multilayer redistribution layer 520 is patterned and etched to expose portions of an RDL layer 526 (e.g., a Ti seed layer). In this arrangement, the multilayer redistribution layer 520 is surrounded by an organic layer 512 and coupled through the first terminal via 540 to the power terminal 532 of the embedded capacitor 530, as shown in the side view of FIG. 5F. In FIG. 5F, the exposed portions of the RDL layer 526 provide an increased resistance path to the power terminal 532 for providing ESR control to the embedded capacitor 530.

In this arrangement, the multilayer redistribution layer 520 is coupled to a second terminal via 550 and the first terminal via 540 through a passivation layer 516. In this configuration, a stripe-based ESR control pattern is selected to provide a predetermined resistance value (e.g., 430 milliohms), assuming the RDL layer 526 is a one-thousand (1000) angstrom (A) layer of sputtered Ti. The multilayer redistribution layer 520 coupled to the ground terminal 534 through the second terminal via 550 does not include exposed portions of the RDL layer 526. Although shown as terminal vias, the first terminal via 540 and the second terminal via 550 may be arranged as a UBM via, an AP via or a terminal via.

Figure 6:
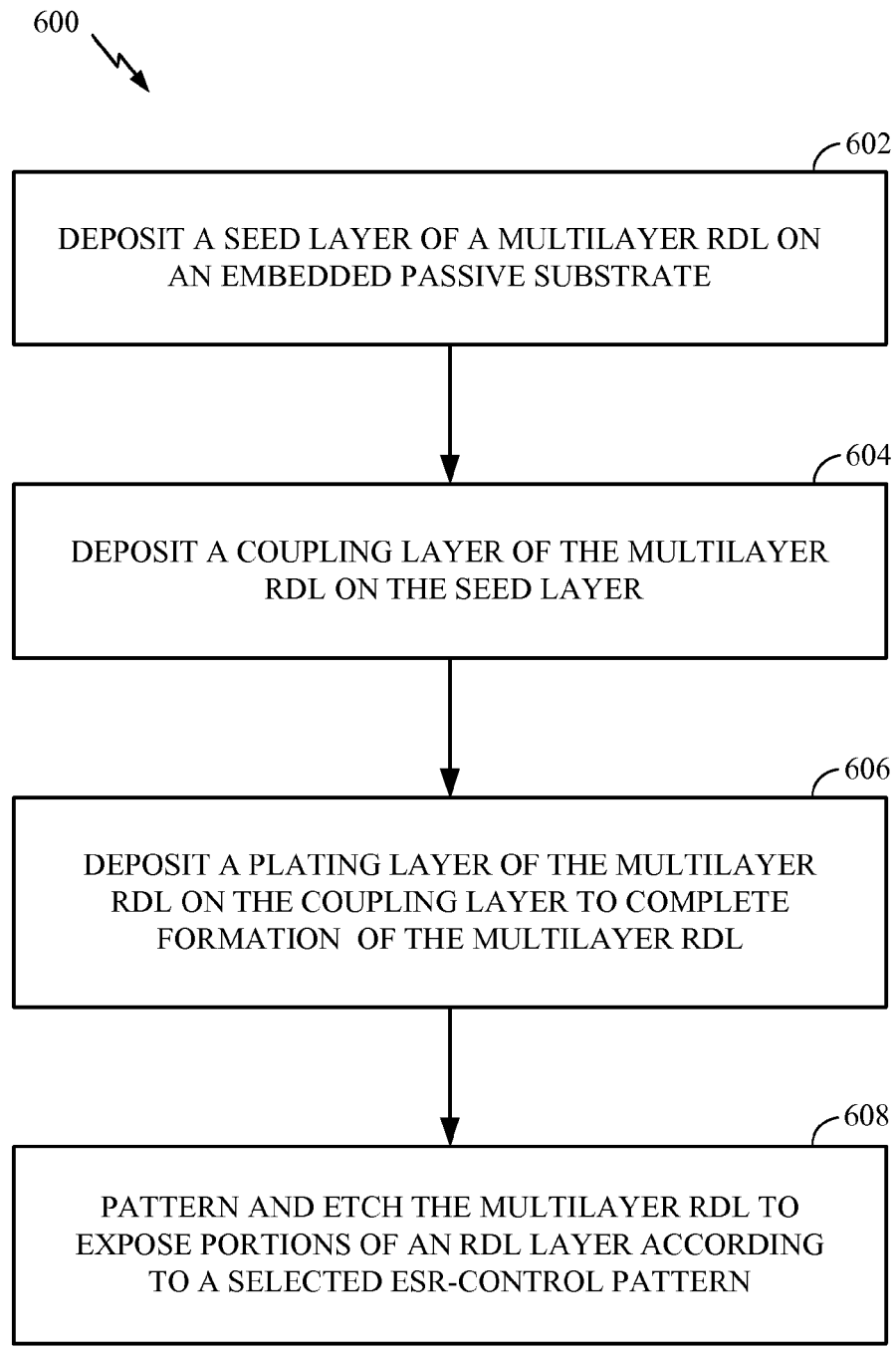
FIG. 6 is a process flow diagram illustrating a method for fabricating a fan-out wafer level package structure according to an aspect of the present disclosure.

FIG. 6 is a flow diagram illustrating a method 600 for fabricating a fan-out wafer level package structure according to one aspect of the disclosure. At block 602, a seed layer of a multilayer redistribution layer (RDL) is deposited on an embedded passive substrate of the fan-out wafer level package structure. The multilayer RDL including the seed layer is shown in FIGS. 4A to 5F. At block 604, a coupling layer of the multilayer RDL is deposited on the seed layer. At block 606, a plating layer of the multilayer RDL is deposited on the coupling layer to complete formation of the multilayer RDL. For example, as shown in FIG. 4A, the multilayer redistribution layer 420 includes a seed layer 426, a coupling layer 424 on the seed layer 426 and a plating layer 422 on the coupling layer 424. In block 608, the multilayer RDL is patterned and etched to expose portions of an RDL layer according to a selected ESR control pattern. In this arrangement, the multilayer redistribution layer 520 provides an increased resistance path for the embedded capacitor 530 by exposing portions of the RDL layer 526, for example, as shown in FIGS. 5B to 5F.

In one configuration, a fan-out wafer level package structure includes a multilayer redistribution layer (RDL) according to aspects of the present disclosure. The multilayer RDL may be configured to couple with a means for storing charge. The multilayer RDL includes sections with fewer layers than other sections of the multilayer RDL according to a selected equivalent series resistance (ESR) control pattern. In one aspect of the disclosure, the charge storing means is the embedded capacitor 330/530 of FIGS. 3, 5A and 5C, configured to perform the functions recited by the charge storing means. In another aspect, the aforementioned means may be a device or any layer configured to perform the functions recited by the aforementioned means. Aspects of the present disclosure further include a step for or steps for performing the method, for example, as shown in FIG. 6.

A fan-out wafer level package structure within a power delivery network, according to aspects of the present disclosure, includes a multilayer redistribution layer (RDL). The multilayer RDL may be configured to couple with terminals of a capacitor embedded within the fan-out wafer level package structure. In one configuration, the multilayer RDL includes fewer layers than other sections of the multilayer RDL. In this configuration, the multilayer RDL is patterned to expose portions of an RDL layer by removing one or more layers of the multilayer RDL according to a selected equivalent series resistance (ESR) control pattern.

According to aspects of the present disclosure, the ESR control pattern is selected to provide a desired ESR value along an increased resistivity path provided by the exposed portions of the RDL layer. When the multilayer RDL is coupled to an embedded capacitor, the exposed portions of the RDL layer provide ESR control of the embedded capacitor along an increased resistance path. The ESR controlled embedded capacitor suppresses resonance in the power delivery network including the fan-out wafer level package structure. The increased resistance path provided by the exposed portions of the RDL layer of the multilayer RDL for ESR control may be verified through testing.

The multilayer is coupled to terminals of the embedded capacitor. The multilayer RDL may be a fan-out routing layer. The multilayer RDL may be patterned and etched to expose portions of a seed layer (e.g., titanium) according to a selected ESR control pattern. The ESR control pattern may be selected to provide a predetermined resistance within a predetermined range (e.g., 100 milliohms to 500 milliohms). The multilayer redistribution layer may be coupled to a chip to provide ESR control. Implementing the fan-out wafer level package structure with embedded ESR control provides a damping feature, while suppressing resonance within a power distribution network.

Figure 7:
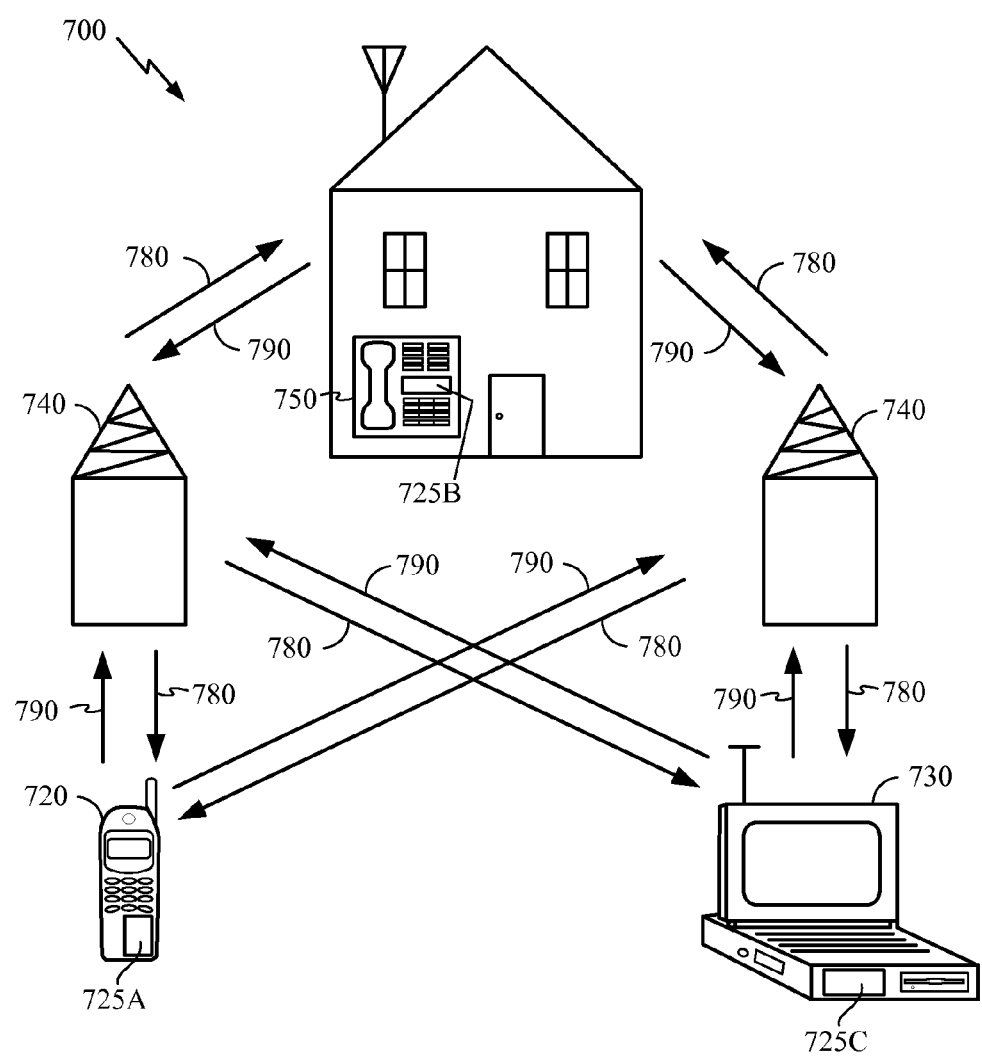
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed fan-out wafer level package structure. It will be recognized that other devices may also include the disclosed fan-out wafer level package structure, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units 720, 730, and 750 may be a mobile phone, a hand-held personal communication systems (PCS) unit, a communications device, a portable data unit such as a personal digital assistant (PDA), a GPS enabled device, a navigation device, a set top box, a music player, a video player, an entertainment unit, a fixed location data unit such as a meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed devices.

Figure 8:
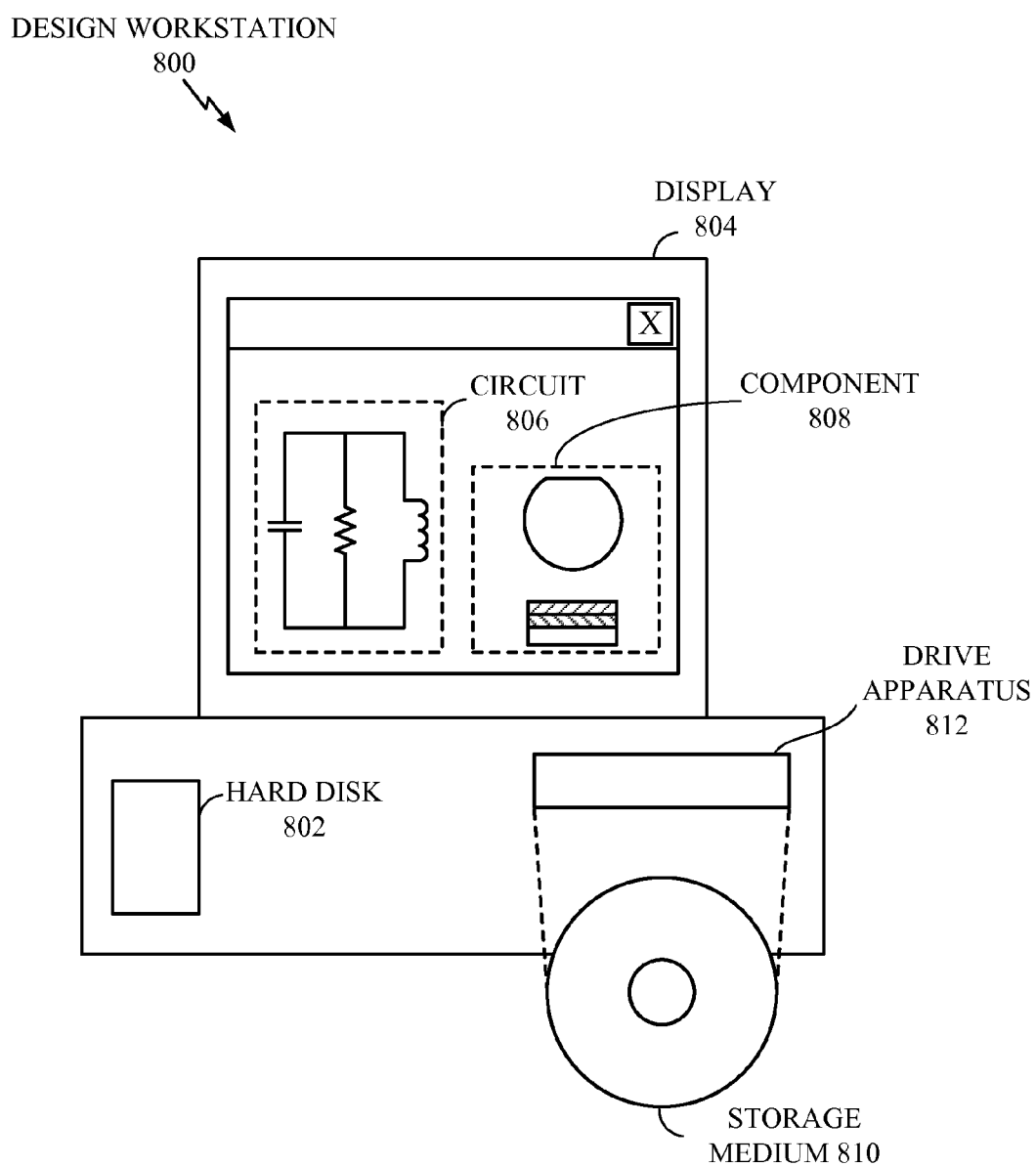
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the devices disclosed above. A design workstation 800 includes a hard disk 802 containing operating system software, support files, and design software such as Cadence or OrCAD. The design workstation 800 also includes a display 804 to facilitate design of a circuit 806 or a semiconductor component 808 such as a fan-out wafer level package structure. A storage medium 810 is provided for tangibly storing the design of the circuit 806 or the semiconductor component 808. The design of the circuit 806 or the semiconductor component 808 may be stored on the storage medium 810 in a file format such as GDSII or GERBER. The storage medium 810 may be a CD-ROM, DVD, hard disk, flash memory, or other appropriate device. Furthermore, the design workstation 800 includes a drive apparatus 812 for accepting input from or writing output to the storage medium 810.

Data recorded on the storage medium 810 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 810 facilitates the design of the circuit 806 or the semiconductor component 808 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A power delivery network, comprising:
a fan-out wafer level package structure comprising a multilayer redistribution layer (RDL) configured to couple with terminals of an embedded capacitor, the multilayer RDL comprising sections with fewer layers than other sections of the multilayer RDL according to a selected equivalent series resistance (ESR) control pattern.

2. The power delivery network of claim 1, further comprising a semiconductor die supported by the fan-out wafer level package structure.

3. The power delivery network of claim 1, in which the multilayer RDL comprises a post passivation interconnect including a seed layer, a coupling layer on the seed layer and a plating layer on the coupling layer.

4. The power delivery network of claim 3, in which predetermined portions of the post passivation interconnect include only the seed layer to control an ESR of the embedded capacitor and damping of the power delivery network.

5. The power delivery network of claim 1, in which the fan-out wafer level package structure comprises an embedded wafer level ball grid array (eWLB) including an embedded passive substrate.

6. The power delivery network of claim 1, in which portions of an RDL layer within the multilayer RDL are exposed according to the selected ESR control pattern.

7. The power delivery network of claim 1, incorporated into at least one of a music player, a video player, an entertainment unit, a navigation device, a communications device, a personal digital assistant (PDA), a fixed location data unit, and a computer.

8. A power delivery network, comprising:
a fan-out wafer level package structure comprising a multilayer redistribution layer (RDL) configured to couple with a means for storing charge, the multilayer RDL comprising sections with fewer layers than other sections of the multilayer RDL according to a selected equivalent series resistance (ESR) control pattern.

9. The power delivery network of claim 8, further comprising a semiconductor die supported by the fan-out wafer level package structure.

10. The power delivery network of claim 8, in which the multilayer RDL comprises a post passivation interconnect including a seed layer, a coupling layer on the seed layer and a plating layer on the coupling layer.

11. The power delivery network of claim 10, in which predetermined portions of the post passivation interconnect include only the seed layer to control an ESR of the charge storing means and damping of the power delivery network.

12. The power delivery network of claim 8, in which the fan-out wafer level package structure comprises an embedded wafer level ball grid array (eWLB) including an embedded passive substrate.

13. The power delivery network of claim 8, in which portions of an RDL layer within the multilayer RDL are exposed according to the selected ESR control pattern.

14. The power delivery network of claim 8, incorporated into at least one of a music player, a video player, an entertainment unit, a navigation device, a communications device, a personal digital assistant (PDA), a fixed location data unit, and a computer.

* * * * *